(12) United States Patent
Sato et al.

(10) Patent No.: US 10,340,214 B2
(45) Date of Patent: Jul. 2, 2019

(54) CARRIER BASE MATERIAL-ADDED WIRING SUBSTRATE

(71) Applicant: SHINKO ELECTRIC INDUSTRIES CO., LTD., Nagano-Shi, Nagano-Ken (JP)

(72) Inventors: Junji Sato, Nagano (JP); Hitoshi Kondo, Nagano (JP); Katsuya Fukase, Nagano (JP)

(73) Assignee: SHINKO ELECTRIC INDUSTRIES CO., LTD. (JP)

(*) Notice: Subject to any disclaimer, the term of this patent is extended or adjusted under 35 U.S.C. 154(b) by 0 days.

(21) Appl. No.: 15/714,307

(22) Filed: Sep. 25, 2017

(65) Prior Publication Data

US 2018/0090426 A1  Mar. 29, 2018

(30) Foreign Application Priority Data

Sep. 29, 2016  (JP) ................................. 2016-191485

(51) Int. Cl.
*H01L 23/498* (2006.01)
*H05K 3/34* (2006.01)
(Continued)

(52) U.S. Cl.
CPC .... *H01L 23/49822* (2013.01); *H01L 21/4853* (2013.01); *H01L 21/4857* (2013.01);
(Continued)

(58) Field of Classification Search
CPC .. H05K 3/1258; H05K 3/4682; H05K 3/3452; H05K 2203/0562;
(Continued)

(56) References Cited

U.S. PATENT DOCUMENTS 6,192,579 B1 * 2/2001 Hayashi ............ H01L 23/49816
174/262
6,919,634 B2 * 7/2005 Kuramoto .......... H01L 21/4853
257/738

(Continued)

FOREIGN PATENT DOCUMENTS

JP 2009239224 A * 10/2009
JP 2016-048768 A   4/2016
JP 2016048768 A *  4/2016

OTHER PUBLICATIONS

Original Asano (JP2009239224A).*

(Continued)

*Primary Examiner* — Roshn K Varghese
(74) *Attorney, Agent, or Firm* — Tarolli, Sundheim, Covell & Tummino LLP

(57) ABSTRACT

A carrier base material-added wiring substrate includes a wiring substrate and a carrier base material. The wiring substrate includes an insulation layer, a wiring layer arranged on a lower surface of the insulation layer, and a solder resist layer that covers the lower surface of the insulation layer and includes an opening that exposes a portion of the wiring layer as an external connection terminal. The carrier base material is adhered by an adhesive layer to the solder resist layer. The carrier base material includes an opening that is in communication with the opening of the solder resist layer and exposes the external connection terminal. The opening of the carrier base material has a diameter that is smaller than that of the opening of the solder resist layer.

5 Claims, 17 Drawing Sheets

(51) Int. Cl.
  *H01L 21/48* (2006.01)
  *H01L 21/683* (2006.01)
  *H01L 23/31* (2006.01)
  *H01L 23/00* (2006.01)
  *H01L 21/56* (2006.01)
  *H01L 21/66* (2006.01)
(52) U.S. Cl.
  CPC .... *H01L 21/6835* (2013.01); *H01L 23/49811* (2013.01); *H01L 23/49838* (2013.01); *H01L 21/486* (2013.01); *H01L 21/561* (2013.01); *H01L 22/14* (2013.01); *H01L 22/20* (2013.01); *H01L 23/3114* (2013.01); *H01L 23/3128* (2013.01); *H01L 23/49816* (2013.01); *H01L 24/14* (2013.01); *H01L 24/16* (2013.01); *H01L 24/81* (2013.01); *H01L 2221/68345* (2013.01); *H01L 2221/68359* (2013.01); *H01L 2221/68381* (2013.01); *H01L 2224/16227* (2013.01); *H01L 2224/81005* (2013.01); *H01L 2924/15311* (2013.01); *H01L 2924/3511* (2013.01)
(58) Field of Classification Search
  CPC ..... H05K 2203/0147; H05K 2203/308; H05K 2203/0152; H05K 2203/0156; H05K 2203/3478; H05K 3/3478; H01L 23/49822; H01L 23/49838
  See application file for complete search history.

(56) References Cited

U.S. PATENT DOCUMENTS

| | | | |
|---|---|---|---|
| 2009/0020591 A1* | 1/2009 | Sakaguchi | B23K 1/0016 228/180.22 |
| 2009/0242245 A1* | 10/2009 | Asano | H01L 21/6835 174/255 |
| 2009/0242262 A1* | 10/2009 | Asano | H05K 3/0064 174/267 |
| 2013/0244377 A1* | 9/2013 | Arimitsu | H01L 24/96 438/118 |

OTHER PUBLICATIONS

Machine Translation of Asano (JP2009239224A).*
Machine translation of Takekoshi (JP2016048768A) provided with Office Action.*

* cited by examiner

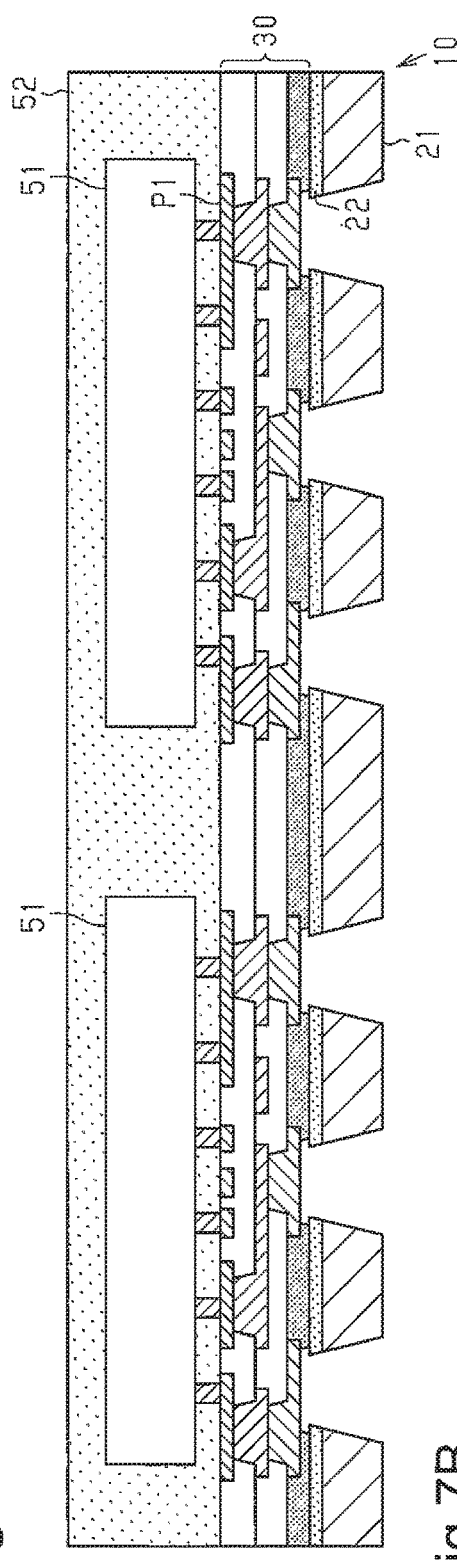
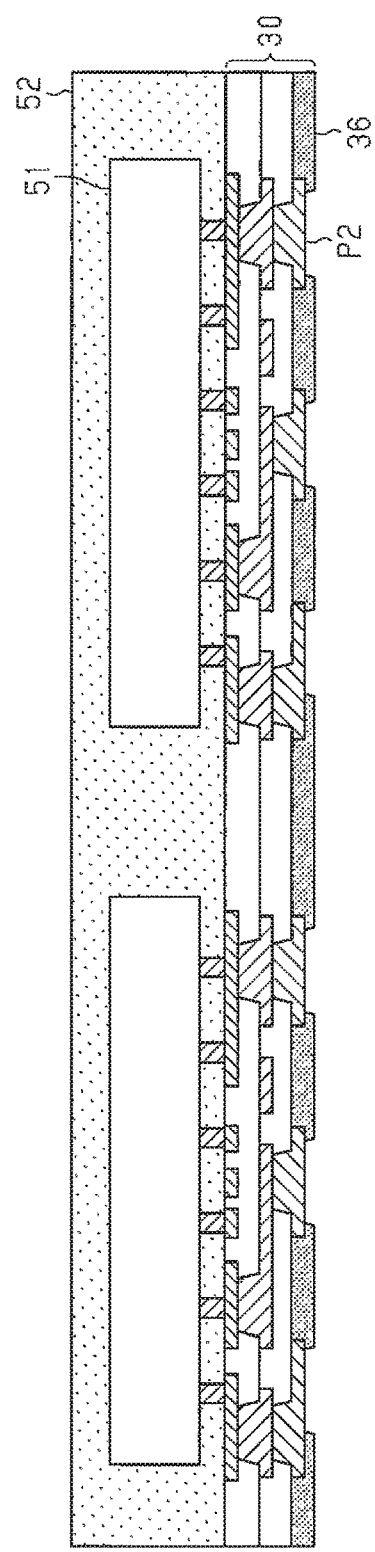

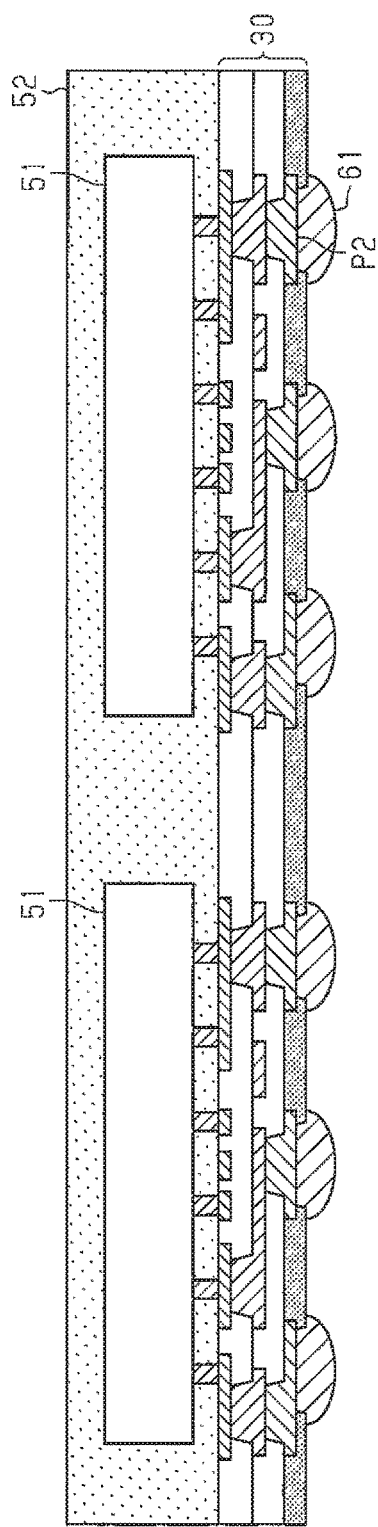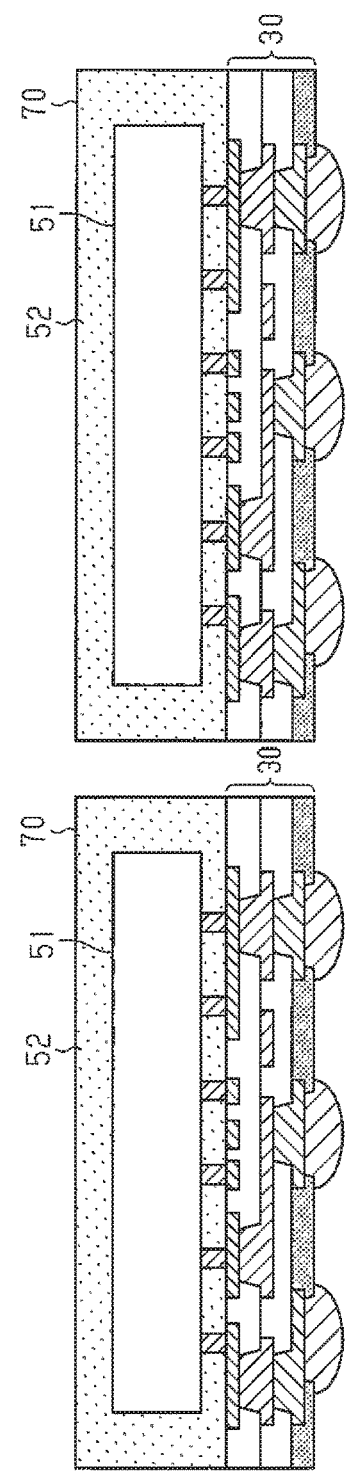

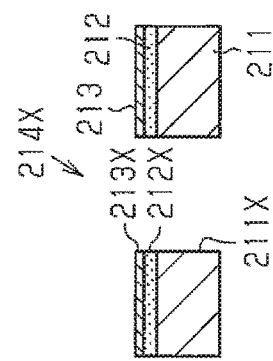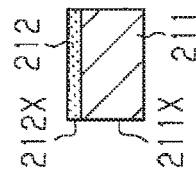

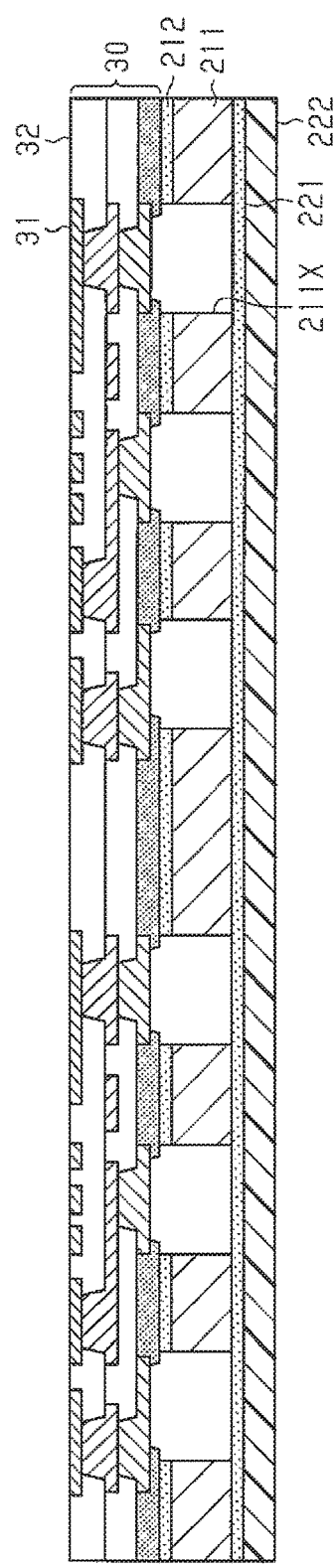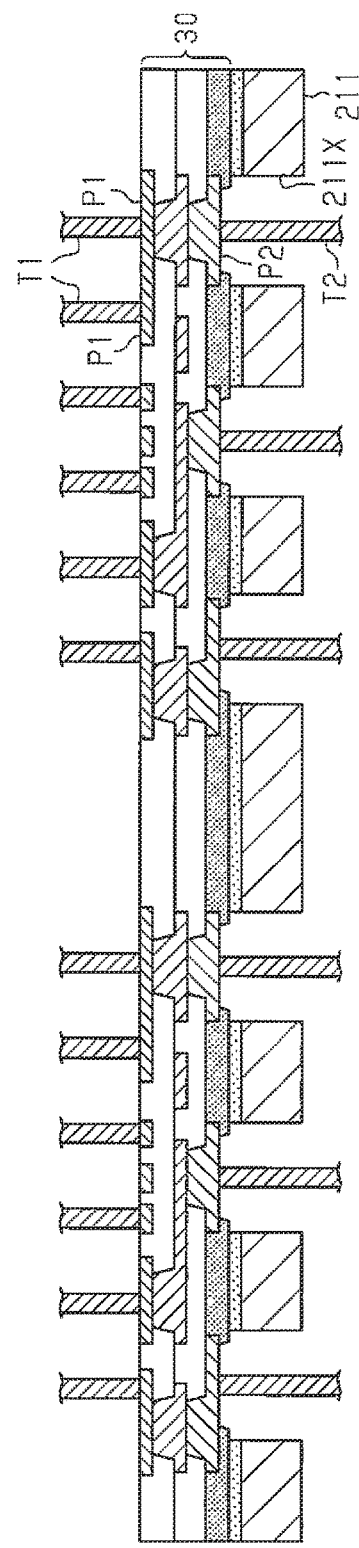

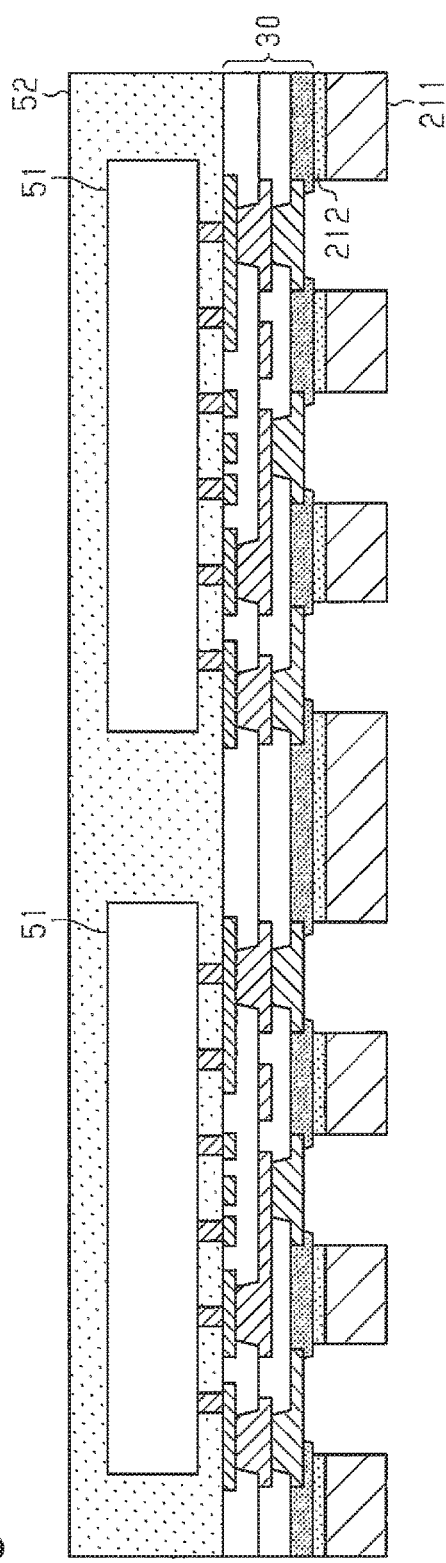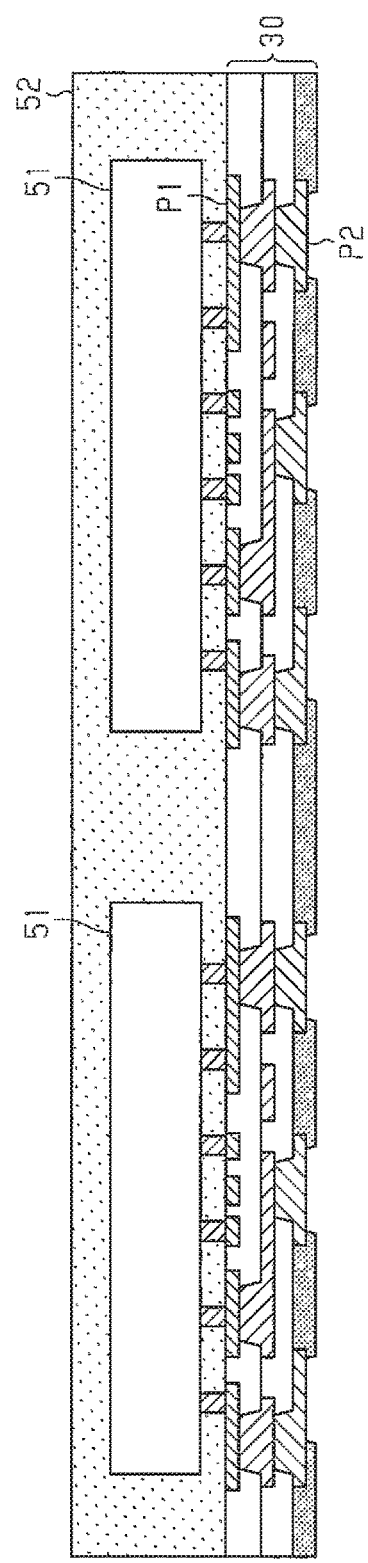

CARRIER BASE MATERIAL-ADDED WIRING SUBSTRATE

CROSS-REFERENCE TO RELATED APPLICATIONS

This application is based upon and claims the benefit of priority from prior Japanese Patent Application No. 2016-191485, filed on Sep. 29, 2016, the entire contents of which are incorporated herein by reference.

FIELD

This disclosure relates to a carrier base material-added wiring substrate and a method for manufacturing a carrier base material-added wiring substrate.

BACKGROUND

The density of the semiconductor elements mounted on a wiring substrate has increased. Now, there is a demand for wiring substrates that are thinner and wiring patterns that are increased in density. A coreless wiring substrate has been proposed to satisfy such demands. A coreless substrate is less a core substrate that has high rigidity and is thicker than an interlayer insulation layer. Such a wiring substrate easily warps and is difficult to handle during manufacturing processes and assembling processes. Japanese Laid-Open Patent Publication No. 2016-048768 describes the manufacturing and assembling of a wiring substrate in a state in which the wiring substrate is adhered to a rigid tentative substrate.

SUMMARY

There is a need to conduct tests that measure electrical characteristics of the wiring substrate to locate wire breakage or the like in a wiring layer incorporated in the wiring substrate. However, when external connection terminals of the wiring substrate are covered by the tentative substrate, test probes or the like cannot contact the external connection terminals.

One embodiment is a carrier base material-added wiring substrate including a wiring substrate and a carrier base material. The wiring substrate includes an insulation layer, a wiring layer arranged on a lower surface of the insulation layer, and a solder resist layer that covers the lower surface of the insulation layer and includes an opening that exposes a portion of the wiring layer as an external connection terminal. The carrier base material is adhered by an adhesive layer to the solder resist layer. The carrier base material includes an opening that is in communication with the opening of the solder resist layer and exposes the external connection terminal. The opening of the carrier base material has a diameter that is smaller than that of the opening of the solder resist layer.

Another embodiment is a method for manufacturing a carrier base material-added wiring substrate. The method includes forming a wiring substrate on one of an upper surface and a lower surface of a support body. The forming a wiring substrate includes alternately stacking a wiring layer and an insulation layer on one of the upper surface and the lower surface of the support body, and forming a solder resist layer including an opening that exposes a portion of the wiring layer as an external connection terminal. The method further includes adhering a carrier base material with an adhesive layer to the solder resist layer and forming an opening in the carrier base material. The opening of the carrier base material is in communication with the opening of the solder resist layer to expose the external connection terminal, and the opening of the carrier base material has a diameter that is smaller than that of the opening of the solder resist layer. The method also includes conducting an electrical test by having a probe contact the external connection terminal from the opening of the carrier base material.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 7A, 7B, 8A, and 8B are schematic cross-sectional views illustrating manufacturing steps of a semi-conductor device including the carrier base material-added wiring substrate of FIG. 1A;

FIGS. 11A, 11B, 12A, 12B, 13, 14, 15A, and 15B are schematic cross-sectional views illustrating manufacturing steps of the carrier base material-added wiring substrate of FIG. 10;

FIGS. 16A, 16B, 17A, and 17B are schematic cross-sectional views illustrating manufacturing steps of a semi-conductor device including the carrier base material-added wiring substrate of FIG. 10.

DESCRIPTION OF THE EMBODIMENTS

Figure 1A:
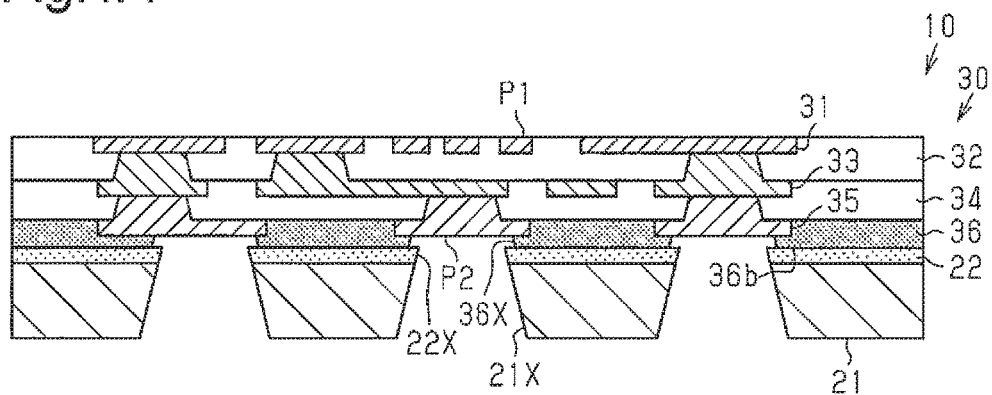
FIG. 1A is a schematic cross-sectional view of a carrier base material-added wiring substrate.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings. In the present specification, a plan view refers to a bird's-eye view of a subject (for example, view in vertical direction of FIG. 1A), and a planar shape refers to the shape of a subject as viewed in a vertical direction.

Referring to FIG. 1A, a carrier base material-added wiring substrate 10 includes a carrier base material 21, an adhesive layer 22, and a wiring substrate 30. The carrier base material 21 is adhered by the adhesive layer 22 to the wiring substrate 30. In the description hereafter, the side of the wiring substrate 10 will be referred to as the upper side, and the side of the carrier base material 21 will be referred to as the lower side. The wiring substrate 30 is adhered by the adhesive layer 22 to the upper surface of the carrier base material 21.

As illustrated in FIG. 1A, the wiring substrate 30 includes a wiring layer 31, an insulation layer 32, a wiring layer 33, an insulation layer 34, a wiring layer 35, and a solder resist layer 36.

The wiring layer 31 is formed in the upper surface of the insulation layer 32 and embedded in the insulation layer 32. In the present example, the wiring layer 31 is embedded in the insulation layer 32 so that the upper surface of the wiring layer 31 is flush with the upper surface of the insulation layer 32. Portions in the upper surface of the wiring layer 31 are used as component connection terminals P1 that are connected to a semiconductor element 51 (refer to FIG. 7A), which is mounted on the wiring substrate 30. The semiconductor element 51 is one example of an electronic component. The insulation layer 32 covers a lower surface and side surfaces of the wiring layer 31.

The wiring layer 33 is formed on the lower surface of the insulation layer 32. The wiring layer 33 includes a wiring pattern, which is formed on the lower surface of the insulation layer 32, and via wiring, which extends through the insulation layer 32 and connects to the wiring layer 31. The insulation layer 34 is formed on the lower surface of the insulation layer 32 and covers the wiring layer 33. The wiring layer 35 is formed on the lower surface of the insulation layer 34. The wiring layer 35 includes a wiring pattern, which is formed on the lower surface of the insulation layer 34, and via wiring, which extends through the insulation layer 34 and connects to the wiring layer 33. In this manner, the wiring substrate 30 has the structure of a coreless wiring substrate obtained by stacking the wiring layer 31, the insulation layer 32, the wiring layer 33, the insulation layer 34, and the wiring layer 35 one upon another.

Figure 1B:
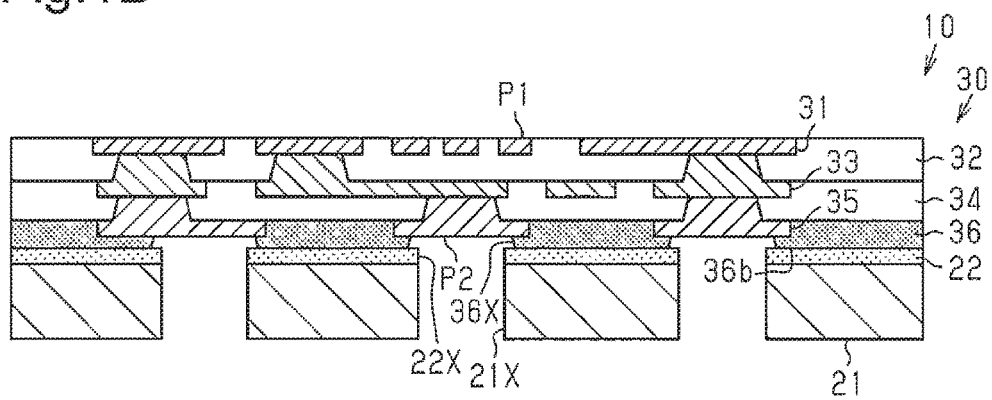
FIG. 1B is a schematic cross-sectional view of another carrier base material-added wiring substrate.
Figure 1C:
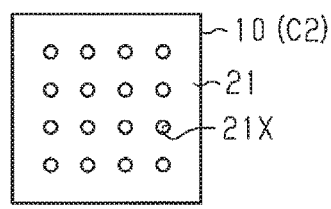
FIG. 1C is a schematic plan view illustrating openings in a solder resist layer.

The solder resist layer 36 is formed on the lower surface of the insulation layer 34 and partially covers the wiring layer 35. The solder resist layer 36 includes openings 36X that expose portions of the lower surface of the wiring layer 35 as external connection terminals P2. As illustrated in FIG. 1C, the openings 36X are arranged in, for example, a matrix-like array. FIG. 1 schematically illustrates one example of the arrangement of the openings 36X but does not limit the arrangement of the openings 36X in direction and number.

The wiring layers 31, 33, and 35 may be formed from, for example, copper (Cu) or a copper alloy. The insulation layers 32 and 34 may be formed from, for example, an insulative resin such as an epoxy resin or a polyimide resin or a resin obtained by mixing a filler such as silica or alumina in an epoxy resin or a polyimide resin. The insulation layers 32 and 34 may be formed by an insulative resin that includes a reinforcement material and is obtained by impregnating a reinforcement material such as a woven cloth or a non-woven cloth of, for example, glass fibers, aramid fibers, or liquid crystal polymer (LCP) fibers with a thermosetting resin of which the main component is an epoxy resin or a polyimide resin. Alternatively, the insulation layers 32 and 34 may be formed from a thermosetting insulative resin or a photosensitive insulative resin.

The solder resist layer 36 may be, for example, a photosensitive dry film resist or a liquid photoresist. Such a resist material may be, for example, a novolak resin or an acrylic resin. For example, when using a photosensitive dry film resist, thermal compression bonding is performed to laminate the insulation layer 34 and the wiring layer 35 with a dry film. Photolithography is performed to pattern the dry film and form the solder resist layer 36 that includes the openings 36X. When using a liquid photoresist, the same processes are performed to form the solder resist layer 36.

When necessary, a surface-processed layer (not illustrated) may be formed on the surface of the wiring layer 35 exposed from the openings 36X. Examples of the surface-processed layer (not illustrated) include a gold (Au) layer, a nickel (Ni)/Au layer (metal layer in which Ni layer is bottom layer and Au layer is formed on Ni layer), and a Ni/palladium (Pd)/Au layer (metal layer in which Ni layer is bottom layer, and Ni layer, Pd layer, and Au layer are stacked one after another). Alternatively, a surface-processed layer that has undergone an oxidation resistant treatment such as an organic solderability preservative (OSP) treatment may be formed on the surface of the wiring layer 35 that is exposed from the openings 36X.

The carrier base material 21 will now be described. The carrier base material 21 is adhered to a lower surface 36b of the solder resist layer 36 by the adhesive layer 22.

The carrier base material 21 includes openings 21X that are in communication with the openings 36X of the solder resist layer 36. The external connection terminals P2 are exposed from the openings 36X of the solder resist layer 36. Accordingly, the external connection terminals P2 are exposed from the openings 21X of the carrier base material 21. The carrier base material 21 is adhered by the adhesive layer 22 to the lower surface 36b of the solder resist layer 36. Thus, the adhesive layer 22 includes openings 22X that are in communication with the openings 36X of the solder resist layer 36 in the same manner as the carrier base material 21.

The adhesive layer 22 may be formed by, for example, a material of which the adhesive force decreases when irradiated with ultraviolet rays.

The carrier base material 21 may be, for example, a core substrate, a metal foil, or a film. An example of a core substrate is a glass epoxy substrate that is a composite of a reinforcement material and a hardened product of a thermosetting resin impregnated in the reinforcement material. The reinforcement material is, for example, a glass cloth (woven glass cloth), non-woven glass cloth, woven aramid cloth, non-woven aramid cloth, woven liquid crystal polymer (LCP) cloth, or non-woven LCP cloth. The thermosetting insulative resin is, for example, an epoxy resin, a polyimide resin, or a cyanate resin. The metal foil may be formed from, for example, copper or stainless steel. The film may be formed from, for example, an epoxy resin, a phenol resin, or a polyimide resin.

In the present embodiment, the diameter of the openings 21X in the carrier base material 21 is set to be smaller than diameter of the openings 36X in the solder resist layer 36. As viewed in FIG. 1A, the openings 21X in the carrier base material 21 are each tapered so that the diameter decreases from the lower surface of the carrier base material 21 (surface at side opposite to adhesive layer 22) toward the upper surface of the carrier base material 21 (surface facing adhesive layer 22). In the present example, the openings 21X in the carrier base material 21 each has a first diameter at the upper surface of the carrier base material 21 (surface contacting adhesive layer 22) and a second diameter at the lower surface of the carrier base material 21 (surface at side opposite to adhesive layer 22). The second diameter is larger than the first diameter. The first diameter of the openings 21X in the carrier base material 21 is set to be smaller than the diameter of the openings 36X in the solder resist layer 36. Further, the carrier base material 21 extends inward from the edge of each opening 36X in the solder resist layer 36. That is, the carrier base material 21 entirely covers the edges of the solder resist layer 36 defining the openings 36X. In other words, the carrier base material 21 entirely covers the lower surface 36b of the solder resist layer 36.

The openings 21X in the carrier base material 21 may each have, for example, a circular planar shape. However, the openings 21X in the carrier base material 21 are not limited to such a planar shape and may have the shape of a polygon such as a square.

In the present embodiment, the openings 21X in the carrier base material 21 each have a tapered cross-sectional shape. However, there is no limit to such a shape. As illustrated in FIG. 1B, the openings 21X in the carrier base material 21 may each be shaped so that the wall of the opening 21X extends straight in the vertical direction. For example, the diameter of each opening 21X may be the same from the upper surface of the carrier base material 21 (surface contacting adhesive layer 22) to the lower surface of the carrier base material 21 (surface at side opposite to adhesive layer 22). When the openings 21X in the carrier base material 21 are each shaped so that the wall of the opening 21X extends straight in the vertical direction, the diameter of the openings 21X in the carrier base material 21 is set to be smaller than the diameter of the openings 36X in the solder resist layer 36 in the same manner as when the openings 21X each have a tapered cross-section.

The manufacturing steps of the carrier base material-added wiring substrate 10 will now be described. In the description hereafter, the reference characters in the drawings are only added to components that will be described. Further, to facilitate understanding, the reference characters used in the drawings are in conformance with the reference characters used for the ultimate elements of the semiconductor device.

As illustrated in FIG. 1B, the carrier base material-added wiring substrate 10 is a sheet-like substrate. The carrier base material-added wiring substrate 10 is cut out from a large substrate (work substrate).

Figure 9A:
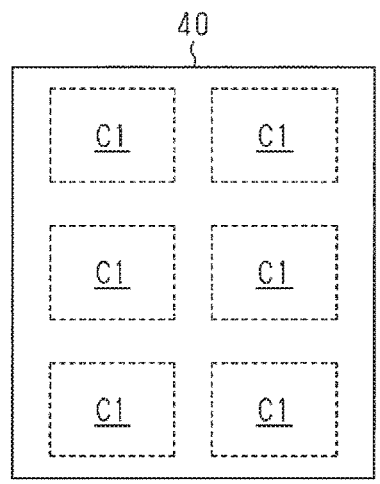
FIGS. 9A to 9C are schematic plan views illustrating manufacturing steps of the carrier base material-added wiring substrate of FIG. 1A.

As illustrated in FIG. 9A, a work substrate 40 is a large substrate including a plurality of (six in FIG. 9A) blocks C1 (each rectangular and illustrated by broken lines). The work substrate 40 is cut in a sheet-cutting step, which will be described later, to form a plurality of (three in FIG. 9B) carrier base material-added wiring substrates 10. In the present embodiment, each manufacturing step until the sheet-cutting step is performed with the work substrate 40 in the state of FIG. 9A. FIG. 9C illustrates an example of the arrangement of the blocks C1. As illustrated in FIG. 9C, the carrier base material-added wiring substrates 10 of the present embodiment are, for example, sheet-like substrates. The carrier base material-added wiring substrates 10 are each formed to have a rectangular shape in a plan view. Each carrier base material-added wiring substrate 10 includes a plurality of (two in FIG. 9C) blocks C1. The blocks C1 are separated from each other. Each block C1 includes a plurality of regions C2 that are in a matrix-like array. The mounting of a semiconductor element and the formation of an encapsulation resin are performed on each region C2. Then, the carrier base material 21 illustrated in FIG. 1A is removed. The sheet-like substrate is cut along the solid lines extending around each region C2 to singulate a plurality of semiconductor devices (semiconductor packages). FIG. 1A schematically illustrates the cross section of a single region C2.

A method for manufacturing the carrier base material-added wiring substrate 10 in two representative regions C2 will now be described. When necessary, the work substrate 40 of FIG. 9A will be referred to in the description.

Figure 2A:
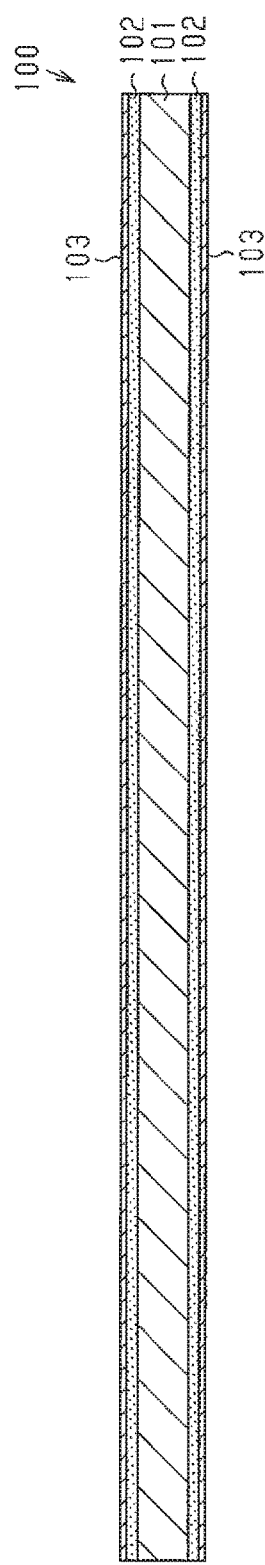
FIGS. 2A, 2B, 3, 4, 5A, 5B, and 6 are schematic cross-sectional views illustrating manufacturing steps of the carrier base material-added wiring substrate of FIG. 1A.

The step of FIG. 2A forms a support body 100 including a support substrate 101, adhesive layers 102, and metal layers 103. One adhesive layer 102 and one metal layer 103 is formed on one side of the support substrate 101. One adhesive layer 102 and one metal layer 103 is formed on the other side of the support substrate 101.

The support substrate 101 may be a member formed by, for example, impregnating a glass cloth (woven cloth), non-woven glass cloth, or aramid fibers with an epoxy resin or the like. Each adhesive layer 102 may be, for example, a metal foil such as a copper foil, an aluminum foil, a nickel foil or a zinc foil; a ceramic plate; or a resin sheet of which the main component is a resin such as acryl or polyimide. Each metal layer 103 may be, for example, a copper foil or the like.

Figure 2B:
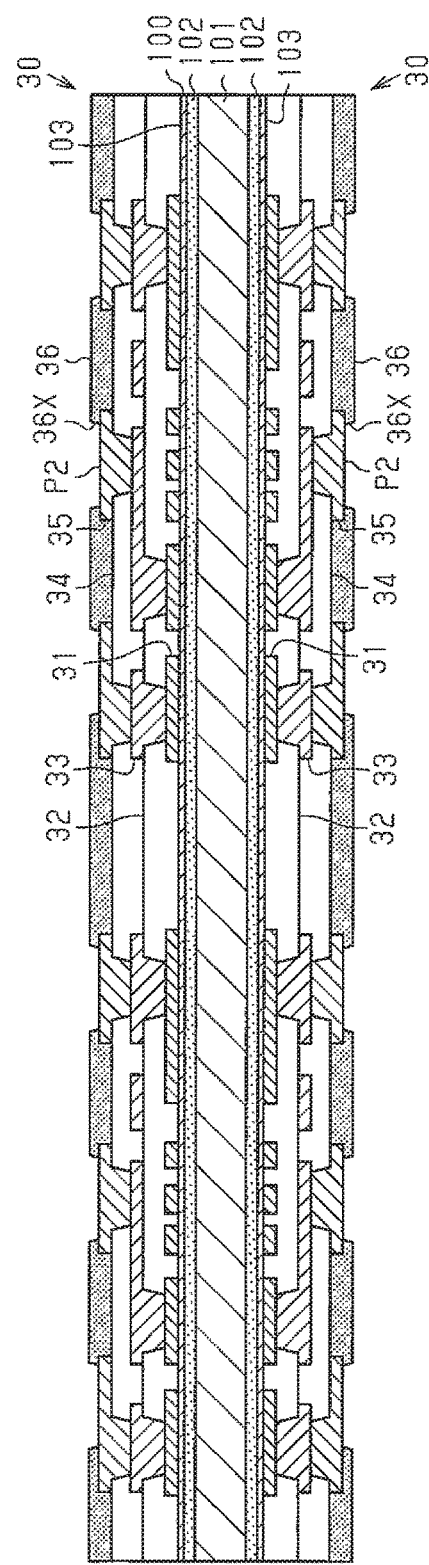

The step of FIG. 2B forms the wiring substrate 30 on the metal layer 103 on each surface of the support body 100. The wiring substrate 30 includes the wiring layer 31, the insulation layer 32, the wiring layer 33, the insulation layer 34, the wiring layer 35, and the solder resist layer 36. The wiring layer 31, the insulation layer 32, the wiring layer 33, the insulation layer 34, the wiring layer 35, and the solder resist layer 36 are stacked one after another on the metal layer 103 to form the wiring substrate 30.

The wiring layer 31 is first formed on the metal layer 103. The wiring layer 31 is formed using various types of wire formation processes such as a semi-additive process. For example, a resist layer including openings at certain locations is formed on the surface of the metal layer 103. The openings expose the metal layer 103 at portions corresponding to the wiring layer 31. The resist layer may be a photosensitive dry film resist or a liquid photoresist. Such photoresists may be, for example, a novolak resin or an acrylic resin. Then, electrolytic plating (electrolytic copper plating) is performed using the resist layer as a mask and the metal layer 103 as a plating power supplying layer to form the wiring layer 31 on the metal layer 103. Then, the resist layer is removed with, for example, an alkali delamination liquid.

The wiring layer 31 on the upper surface of the metal layer 103 is covered and laminated by an insulative resin film of a thermosetting epoxy resin or the like to form the insulation layer 32. A liquid or paste of an insulative resin such as a thermosetting epoxy resin may be applied and hardened to form the insulation layer 32. Via holes are then formed extending through the insulation layer 32 to expose portions of the wiring layer 31. The via holes may be formed by, for example, performing laser drilling with a $CO_2$ laser or the like. When necessary, a desmearing process may also be performed.

The wiring layer 33 is then formed. The wiring layer 33 may be formed through, for example, a semi-additive process. For example, a seed layer is first formed on the upper surface of the insulation layer 32 by performing, for example, electroless plating. Then, a resist layer including openings at given locations are formed on the seed layer. As described above, the resist layer may be a photosensitive dry film resist or a liquid photoresist (e.g., novolak resin or acrylic resin). Then, electrolytic plating (electrolytic copper plating) is performed using the resist layer as a mask and the seed layer as a plating power supplying layer to form an electrolytic plating layer. After removing the resist layer with, for example, an alkali delamination liquid, etching is performed using the electrolytic plating layer as an etching mask to remove unnecessary portions of the seed layer. This forms the wiring layer 33.

Then, steps that are the same as the step of forming the insulation layer 32 and the step of forming the wiring layer 33 are repeated to form the insulation layer 34 and the wiring layer 35. In this manner, a given number of wiring layers and insulation layers are alternately stacked upon one another to form a wiring structure.

Then, the solder resist layer 36, which includes the openings 36X, is formed on the upper surfaces of the wiring layer 35 and the insulation layer 34. The solder resist layer 36 is formed by, for example, laminating the upper surfaces of the wiring layer 35 and the insulation layer 34 with a photosensitive resin film or applying a liquid or paste resin to the upper surfaces of the wiring layer 35 and the insulation layer 34. The resin is patterned into a certain shape by undergoing exposure and development in a photolithography process. The openings 36X expose portions in the upper surface of the wiring layer 35 as the external connection terminals P2.

Figure 3:
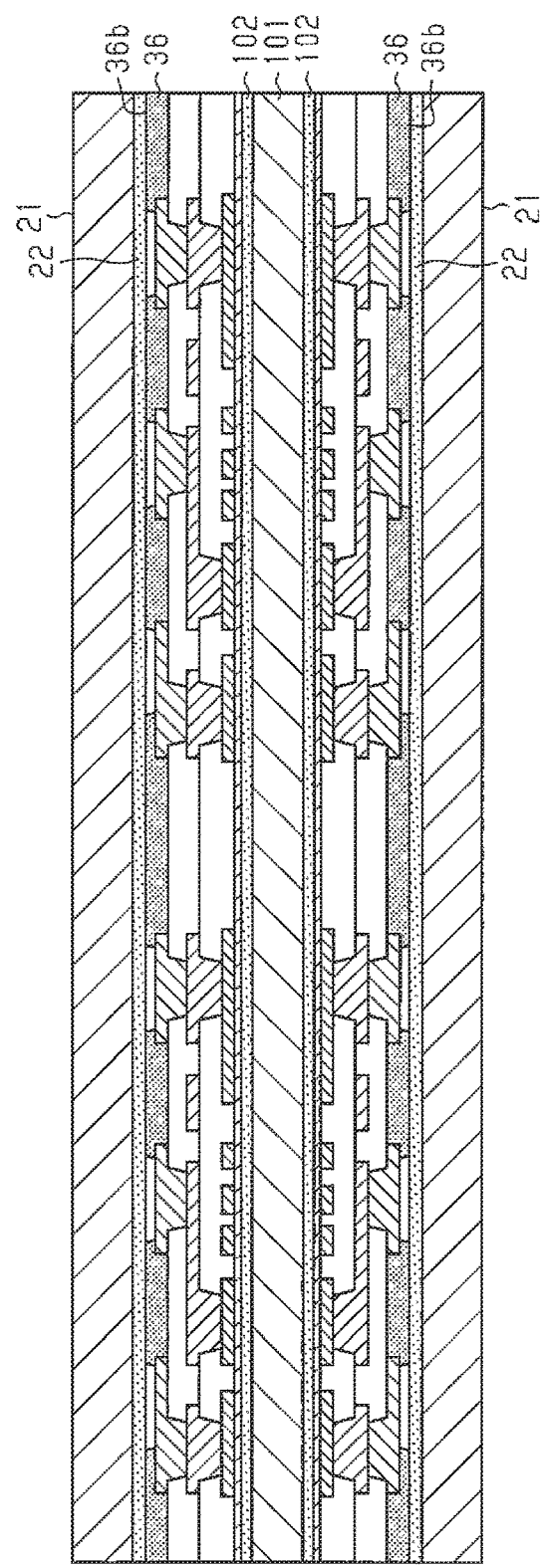

In the step of FIG. 3, each carrier base material 21, which covers the entire surface of the corresponding solder resist layer 36, is adhered by the corresponding adhesive layer 22 to the surface of the solder resist layer 36 (surface corresponding to lower surface 36b in FIG. 1A).

Figure 4:
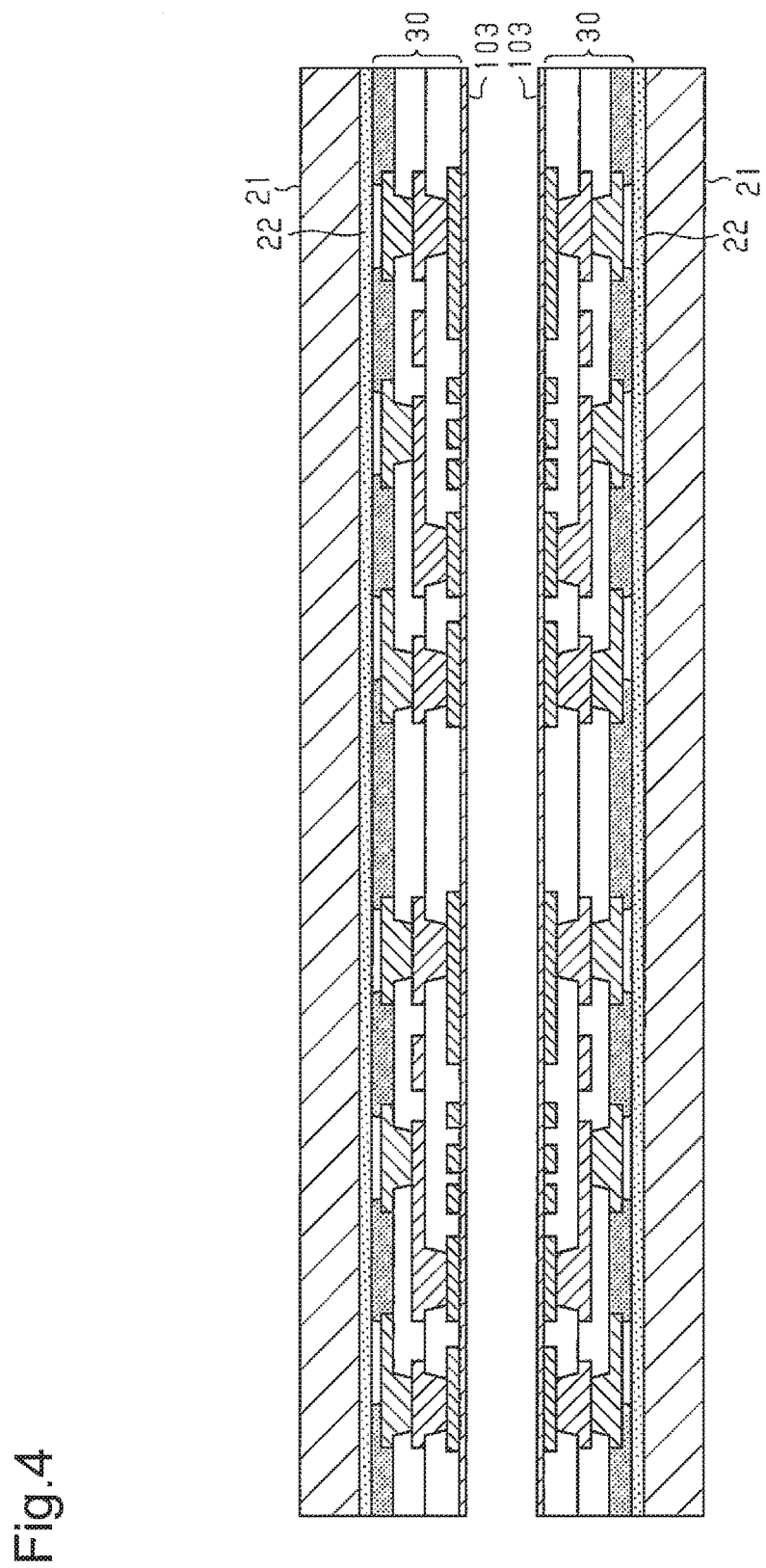

In the step of FIG. 4, the two wiring substrates 30 are separated from the support substrate 101 illustrated in FIG. 3. When separated from the support substrate 101, each wiring substrate 30 is supported by the carrier base material 21.

Figure 5A:
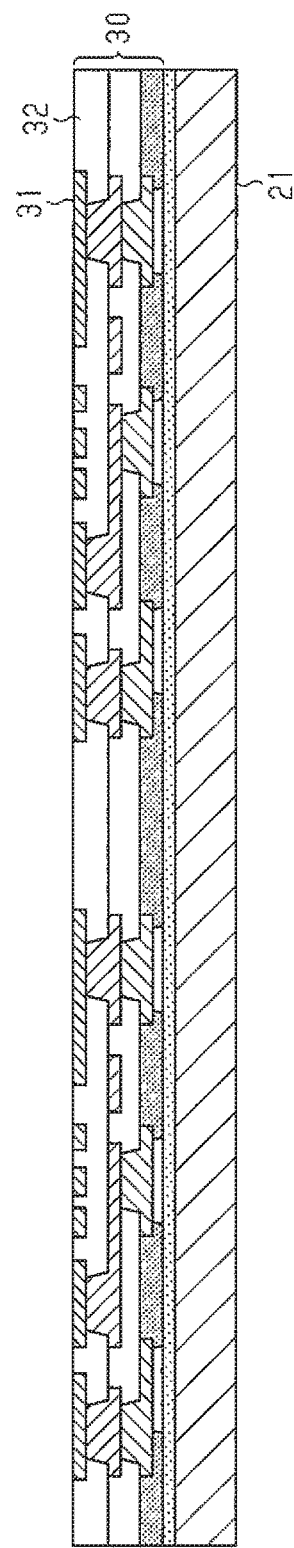

In the step of FIG. 5A, etching is performed to remove the metal layer 103 (refer to FIG. 4) and expose the upper surfaces of the wiring layer 31 and the insulation layer 32.

Figure 5B:
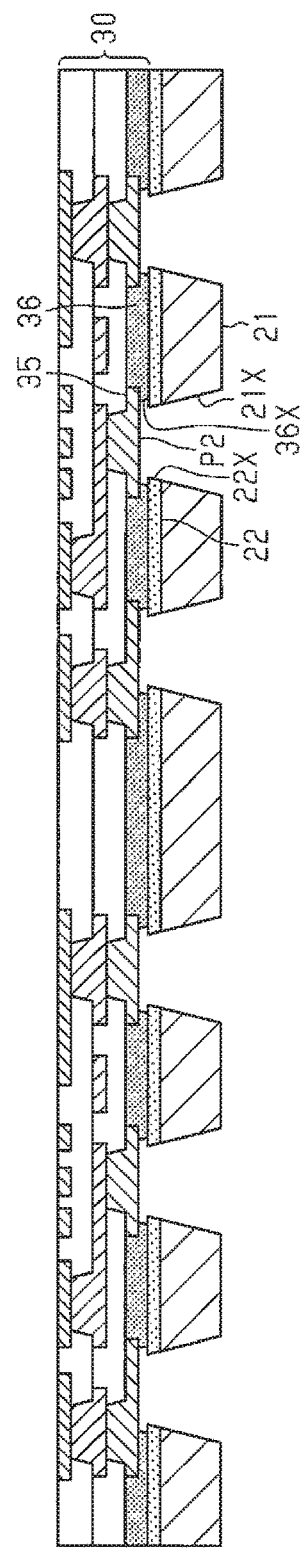

In the step of FIG. 5B, the openings 21X are formed in the carrier base material 21, and the openings 22X are formed in the adhesive layer 22 to expose the external connection terminals P2. The openings 21X and 22X may be formed by, for example, performing laser drilling with a CO2 laser or a YAG laser. In this step, the diameter of the openings 36X in the solder resist layer 36 is larger than the diameter of the openings 21X and 22X.

In this manner, the formation of the openings 21X in the carrier base material 21, which is adhered to the wiring substrate 30, allows the openings 21X to be formed with high positional precision. Further, the diameter of the openings 21X in the carrier base material 21 is smaller than the diameter of the openings 36X in the solder resist layer 36. Thus, in the step that forms the openings 21X in the carrier base material 21, irradiation of the solder resist layer 36 with laser light used for processing is limited. This reduces the effect of the laser light on the solder resist layer 36.

The openings 21X in the carrier base material 21 (and openings 22X in adhesive layer 22) only need to be large enough to allow for the insertion of a probe electrode used when conducting an electrical test on the wiring substrate 30. The probe electrodes are located at positions corresponding to the external connection terminals P2 of the wiring substrate 30. Precise formation of the openings 21X in the carrier base material 21 allow for easy insertion of the probe electrodes and easy contact of the probe electrodes with the external connection terminals P2.

Referring to FIG. 5B, each opening 21X formed in the carrier base material 21 is tapered so that the diameter decreases from the lower surface of the carrier base material 21 (surface at side opposite to adhesive layer 22) toward the upper surface of the carrier base material 21 (surface contacting adhesive layer 22). In the present example, each opening 21X in the carrier base material 21 has the first diameter at the upper surface of the carrier base material 21 (surface contacting adhesive layer 22) and the second diameter, which is larger than the first diameter, at the lower surface of the carrier base material 21 (surface at side opposite to adhesive layer 22). The first diameter of each opening 21X in the carrier base material 21 is set to be smaller than the diameter of each opening 36X in the solder resist layer 36. However, the openings 21X in the carrier base material 21 are not limited to such a structure and may extend straight in the vertical direction.

Figure 6:
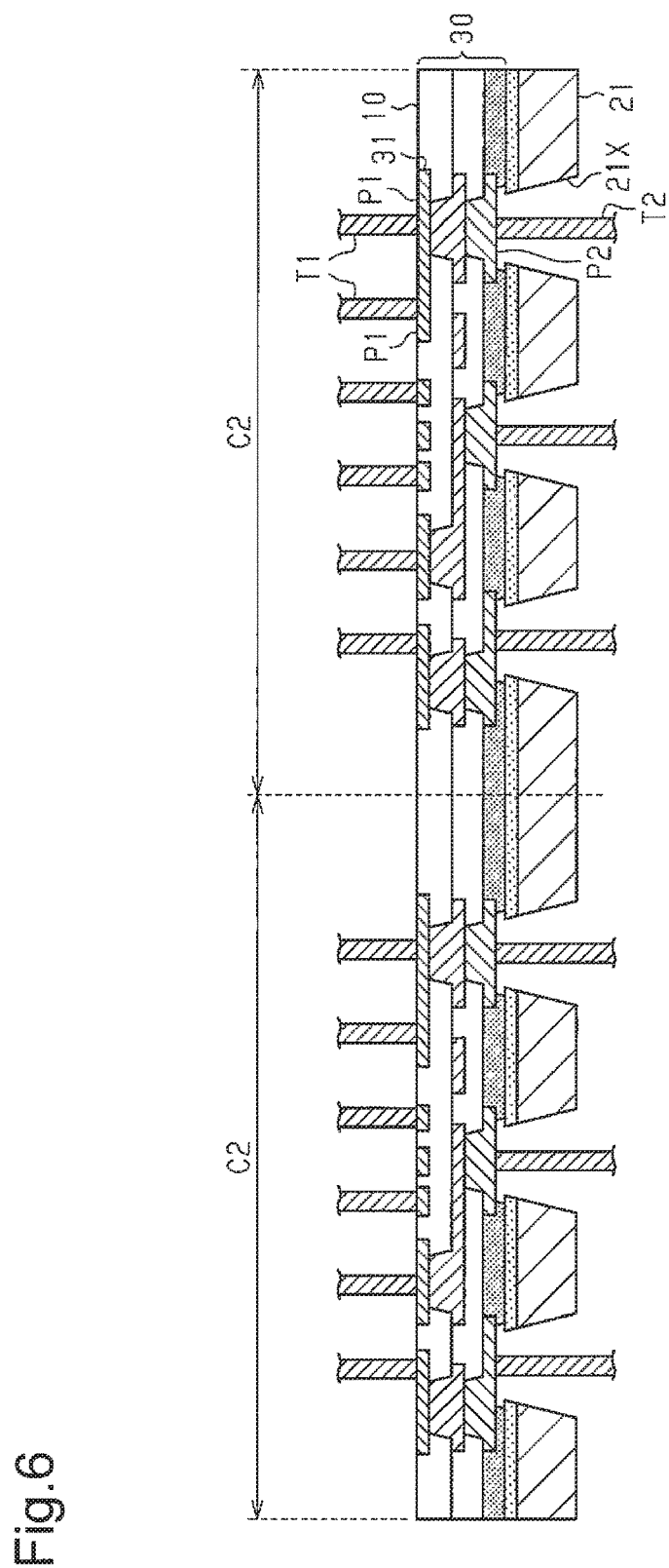

In the step of FIG. 6, sheet-cutting is performed to form the carrier base material-added wiring substrate 10, and an electrical test is conducted on the wiring substrate 30 that is included in the carrier base material-added wiring substrate 10. That is, an electrical test is conducted on the wiring structure (refer to FIG. 1A) included in each region C2 of the sheet-like carrier base material-added wiring substrate 10.

Figure 9B:
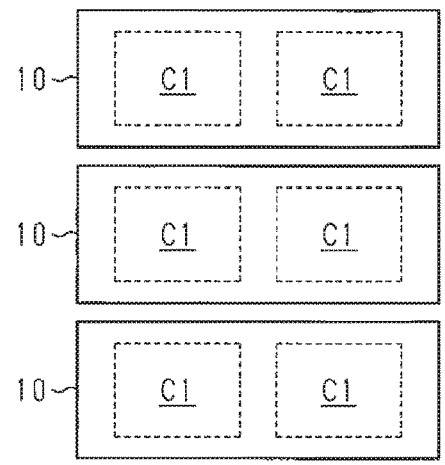
Figure 9C:
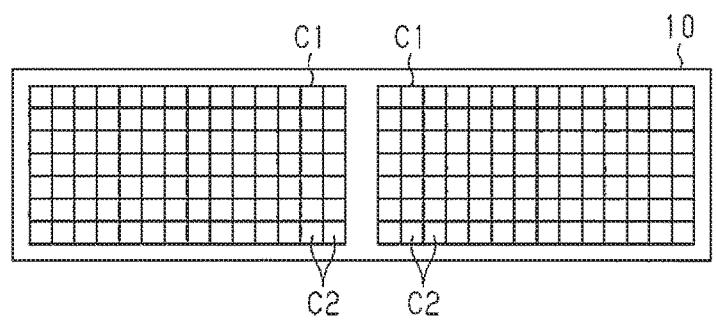

The work substrate 40 illustrated in FIG. 9A is cut to form the sheet of the carrier base material-added wiring substrate 10 illustrated in FIG. 9B. Then, the electrical test is performed on the sheet of the carrier base material-added wiring substrate 10.

Referring to FIG. 6, an electrical test is conducted on the sheet-like carrier base material-added wiring substrate 10. In the present example, probe terminals T1 contact the component connection terminals P1 in the upper surface of the wiring substrate 30, and probe terminals T2 contact the external connection terminals P2 in the lower surface of the wiring substrate 30. Various types of electrical tests (open test, short test, and the like) are conducted on the wiring substrate 30 with the probe terminals T1 and T2.

The wiring substrate 30 is supported by the carrier base material 21. This facilitates handling (carrying) of the wiring substrate 30 when performing an electrical test with a test device. The carrier base material 21 includes the openings 21X that expose the external connection terminals P2 of the wiring substrate 30. Accordingly, the test probe terminals T2 can easily contact the external connection terminals P2 in the wiring substrate 30, which is adhered to the carrier base material 21, to conduct an electrical test.

The electrical test, which is conducted as described above, determines whether or not the wiring substrate 30 is defective. The wiring substrate 30 is marked in accordance with the determination result. For example, a given marking is indicated on the wiring substrate 30 when determined as being defective.

The manufacturing steps of a semiconductor device using the carrier base material-added wiring substrate 10 will now be described.

In the step of FIG. 7A, the semiconductor element 51 is connected to the component connection terminals P1 in the upper surface of the carrier base material-added wiring substrate 10. Then, an encapsulation resin 52 is formed to encapsulate the semiconductor element 51. Here, when the wiring substrate 30 has not been marked in the electrical test, that is, when the wiring substrate 30 has been determined as being non-defective, the semiconductor element 51 is mounted on the wiring substrate 30. When the wiring substrate 30 has been marked, that is, when the wiring substrate 30 has been determined as being defective, the semiconductor element 51 is not mounted on the wiring substrate 30. Thus, time is not used in an unnecessary manner to mount a defective wiring substrate onto the semiconductor element 51. This also prevents the semiconductor element 51 from being wasted because of the semiconductor element 51 being mounted on a defective wiring substrate.

The encapsulation resin 52 is formed to cover the semiconductor element 51 and the upper surface of the wiring substrate 30. The encapsulation resin 52 is formed from, for example, a thermosetting epoxy insulative resin. The insulative resin does not necessarily have to be thermosetting and may be photosensitive instead.

In the step of FIG. 7B, the carrier base material 21 and the adhesive layer 22 are removed. For example, the adhesive layer 22 is irradiated with ultraviolet rays to lower the adhesive force of the adhesive layer 22 and remove the carrier base material 21 and the adhesive layer 22.

In the step of FIG. 8A, bumps 61 are formed on the external connection terminals P2 for mounting on another substrate. The bumps 61 are, for example, solder bumps. The bumps 61 may be formed by solder balls arranged on the external connection terminals P2 or by a solder paste that has undergone a reflow process after being applied to the external connection terminals P2.

In the step of FIG. 8B, the structure of FIG. 8A is singulated into the semiconductor devices 70. The wiring substrate 30 and the encapsulation resin 52 illustrated in FIG. 8A are cut along the lines extending around the regions C2 illustrated in FIG. 9C with a dicing blade or the like to singulate the semiconductor devices 70.

The present embodiment has the advantages described below.

(1) The carrier base material-added wiring substrate 10 includes the carrier base material 21, the adhesive layer 22, and the wiring substrate 30. The wiring substrate 30 includes the wiring layer 31, the insulation layer 32, the wiring layer 33, the insulation layer 34, and the wiring layer 35 that are stacked one upon another to obtain a coreless wiring substrate. The solder resist layer 36 is formed on the lower surface of the insulation layer 34 to partially cover the wiring layer 35. The solder resist layer 36 includes the openings 36X that expose portions in the lower surface of the wiring layer 35 as the external connection terminals P2. The carrier base material 21 is adhered by the adhesive layer 22 to the lower surface 36b of the solder resist layer 36. Subsequent to the formation of the sheet of the carrier base material-added wiring substrate 10, the carrier base material 21 facilitates handling of the wiring substrate 30, which has a coreless structure, in the electrical test.

(2) The carrier base material 21 and the adhesive layer 22 include the openings 21X and 22X that expose the external connection terminals P2. In the step in which an electrical test is conducted on the carrier base material-added wiring substrate 10, the probe terminals T2 used for the electrical test are inserted into the openings 21X in the carrier base material 21 to contact the external connection terminals P2, which are exposed from the openings 21X. In this manner, the external connection terminals P2 are exposed from the openings 21X in the carrier base material 21 so that an electrical test can be conducted on the wiring substrate 30 in a state in which the wiring substrate 30 is supported by the carrier base material 21.

(3) The diameter of the openings 21X in the carrier base material 21 is smaller than the diameter of the openings 36X in the solder resist layer 36. Accordingly, the carrier base material 21 extends inward from the edge of each opening 36X in the solder resist layer 36. That is, the carrier base material 21 entirely covers the edges of the solder resist layer 36 defining the openings 36X. In other words, the carrier base material 21 covers the lower surface 36b of the solder resist layer 36. Thus, the solder resist layer 36 is practically not irradiated with the laser light used in the step that forms the openings 21X in the carrier base material 21. This reduces the effect of the laser light on the solder resist layer 36. Further, the probe terminals T2 may be damaged if the solder resist layer 36 of the wiring substrate 30 were to be exposed from the openings 21X in the carrier base material 21. In the present embodiment, when inserting the probe terminals T2 into the openings 21X in the carrier base material 21 to conduct an electrical test on the wiring substrate 30, the probe terminals T2 do not contact the solder resist layer 36. This prevents the probe terminals T2 from damaging the solder resist layer 36.

(4) Referring to FIG. 1A, the openings 21X in the carrier base material 21 are each tapered so that the diameter decreases from the lower surface of the carrier base material 21 (surface at side opposite to adhesive layer 22) toward the upper surface of the carrier base material 21 (surface contacting adhesive layer 22). The tapered openings 21X in the carrier base material 21 guide the probe terminals T2, which are used to conduct an electrical test on the wiring substrate 30, to the external connection terminals P2 even when the probe terminals T2 are displaced. The large diameter at the lower surface of the carrier base material 21 (surface at side opposite to adhesive layer 22) allows for easy insertion of the probe terminals T2.

(5) The carrier base material 21 requires a device for mounting the semiconductor element 51 onto the wiring substrate 30 and a device for transporting the semiconductor element 51 to a device that encapsulates the semiconductor element 51 in the encapsulation resin 52. In a carrier base material that does not include the openings 21X, to conduct an electrical test on the wiring substrate 30, the carrier base material would have to be removed from the wiring substrate 30 and then re-adhered to the wiring substrate 30. In contrast, the carrier base material-added wiring substrate 10 of the present embodiment includes the openings 21X in the carrier base material 21. This eliminates the need for removal and re-adhesion of the carrier baes material. Thus, the number of manufacturing steps and the manufacturing time can be reduced.

Referential Examples

Figure 10:
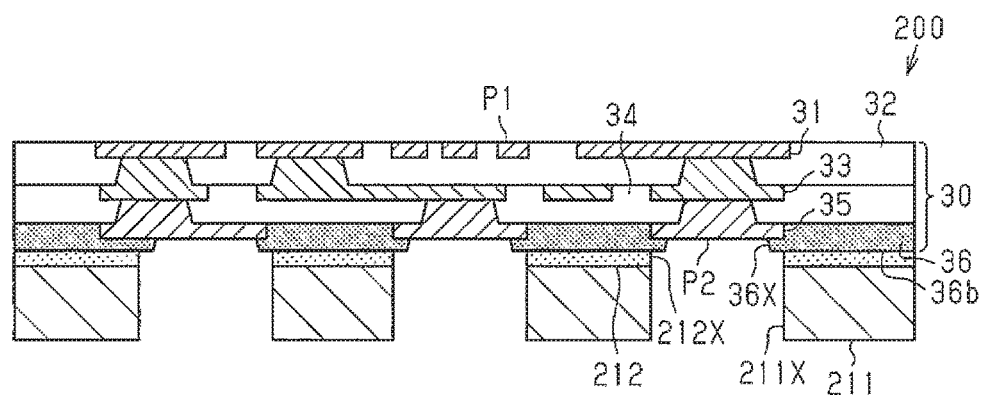
FIG. 10 is a schematic cross-sectional view illustrating a carrier base material-added wiring substrate in a referential example.

FIG. 10 illustrates a carrier base material-added wiring substrate 200 in a referential example. Same reference numerals are given to those components of the carrier base material-added wiring substrate 200 that are the same as the corresponding components in the above embodiment. Such components will not be described in detail.

The carrier base material-added wiring substrate 200 includes a carrier base material 211, an adhesive layer 212, and the wiring substrate 30. The carrier base material 211 is adhered by the adhesive layer 212 to the wiring substrate 30. In the description hereafter, the side of the wiring substrate 30 will be referred to as the upper side, and the side of the carrier base material 211 will be referred to as the lower side. The wiring substrate 30 is adhered by the adhesive layer 212 to the upper surface of the carrier base material 211.

The wiring substrate 30 includes the wiring layer 31, the insulation layer 32, the wiring layer 33, the insulation layer 34, the wiring layer 35, and the solder resist layer 36. The carrier base material 211 is adhered by the adhesive layer 212 to the lower surface 36b of the solder resist layer 36.

The carrier base material 211 includes openings 211X, which are in communication with the openings 36X in the solder resist layer 36. The external connection terminals P2 are exposed from the openings 36X in the solder resist layer 36. Accordingly, the external connection terminals P2 are exposed from the openings 211X in the carrier base material 211. The carrier base material 211 is adhered by the adhesive layer 212 to the lower surface 36b of the solder resist layer 36. Thus, in the same manner as the carrier base material 211, the adhesive layer 212 includes openings 212X that are in communication with the openings 36X in the solder resist layer 36.

The adhesive layer 212 may be formed from, for example, a material of which the adhesive force is decreased when irradiated with ultraviolet rays. The carrier base material 211 may be, for example, a core substrate, a metal foil, or a film.

In this referential example, the diameter of the openings 211X in the carrier base material 211 is set to be larger than the diameter of the openings 36X in the solder resist layer 36. Accordingly, the walls defining the openings 36X in the solder resist layer 36, that is, the edges of the solder resist layer 36 defining the openings 36X, are exposed from the openings 211X in the carrier base material 211.

The manufacturing steps of the carrier base material-added wiring substrate 200 will now be described.

In the step of FIG. 11A, the adhesive layer 212 and a separator 213 are formed on the upper surface of the carrier base material 211. Then, openings 214X are formed extending through the carrier base material 211, the adhesive layer 212, and the separator 213. The openings 214X include the openings 211X of the carrier base material 211, the openings 212X of the adhesive layer 212, and openings 213X of the separator 213. The openings 214X may be formed, for example, by performing machining with a punch or drill or by performing laser drilling.

In the step of FIG. 11B, the separator 213 is removed (refer to FIG. 11A).

Figure 12A:
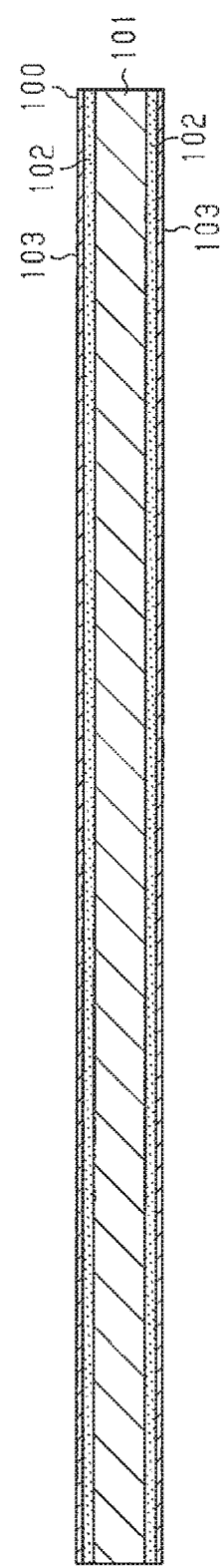

In the step of FIG. 12A, the support body 100 is formed including the support substrate 101, the adhesive layers 102, and the metal layers 103. One adhesive layer 102 and one metal layer 103 is formed on one side of the support substrate 101. One adhesive layer 102 and one metal layer 103 is formed on the other side of the support substrate 101.

The support substrate 101 may be a member formed by, for example, impregnating a glass cloth (woven cloth), non-woven glass cloth, or aramid fibers with an epoxy resin or the like. Each adhesive layer 102 may be, for example, a metal foil such as a copper foil, an aluminum foil, a nickel foil or a zinc foil; a ceramic plate; or a resin sheet of which the main component is a resin such as acryl or polyimide. Each metal layer 103 may be, for example, a copper foil or the like.

Figure 12B:
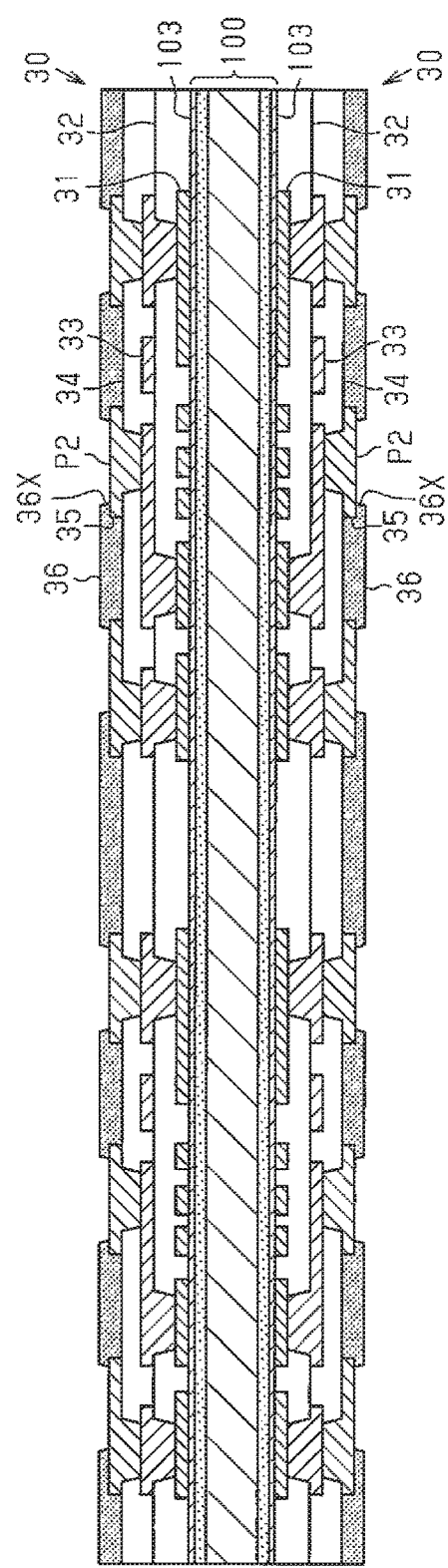

In the step of FIG. 12B, the wiring substrate 30 is formed on the metal layer 103 on each surface of the support body 100. The wiring substrate 30 includes the wiring layer 31, the insulation layer 32, the wiring layer 33, the insulation layer 34, the wiring layer 35, and the solder resist layer 36. The wiring layer 31, the insulation layer 32, the wiring layer 33, the insulation layer 34, the wiring layer 35, and the solder resist layer 36 are stacked one after another on the metal layer 103. Then, the openings 36X are formed in the solder resist layer 36 exposing portions in the upper surface of the wiring layer 35 as the external connection terminals P2.

Figure 13:
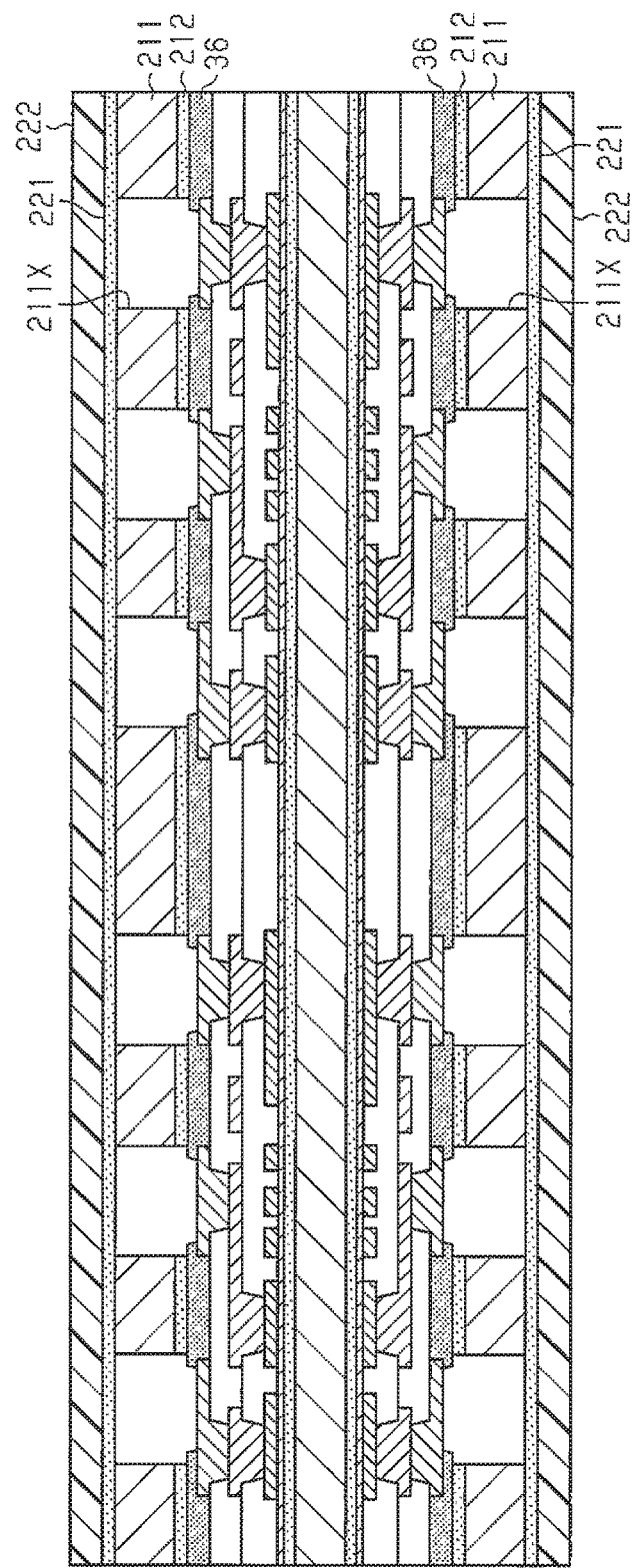

In the step of FIG. 13, the carrier base material 211 (refer to FIG. 11B), which covers the entire surface of the solder resist layer 36, is adhered by the adhesive layer 212 to the surface of the solder resist layer 36. Further, a protection film 222 is adhered by the adhesive layer 221 to the surface of the carrier base material 211. The adhesive layer 221 may be formed from, for example, a material of which the adhesive force decreases when irradiated with ultraviolet rays. The protection film 222 may be formed from a material that is resistant to etching performed in a subsequent step. For example, the protection film 222 may be formed by a photosensitive dry film (e.g., novolak resin or acrylic resin).

Figure 14:
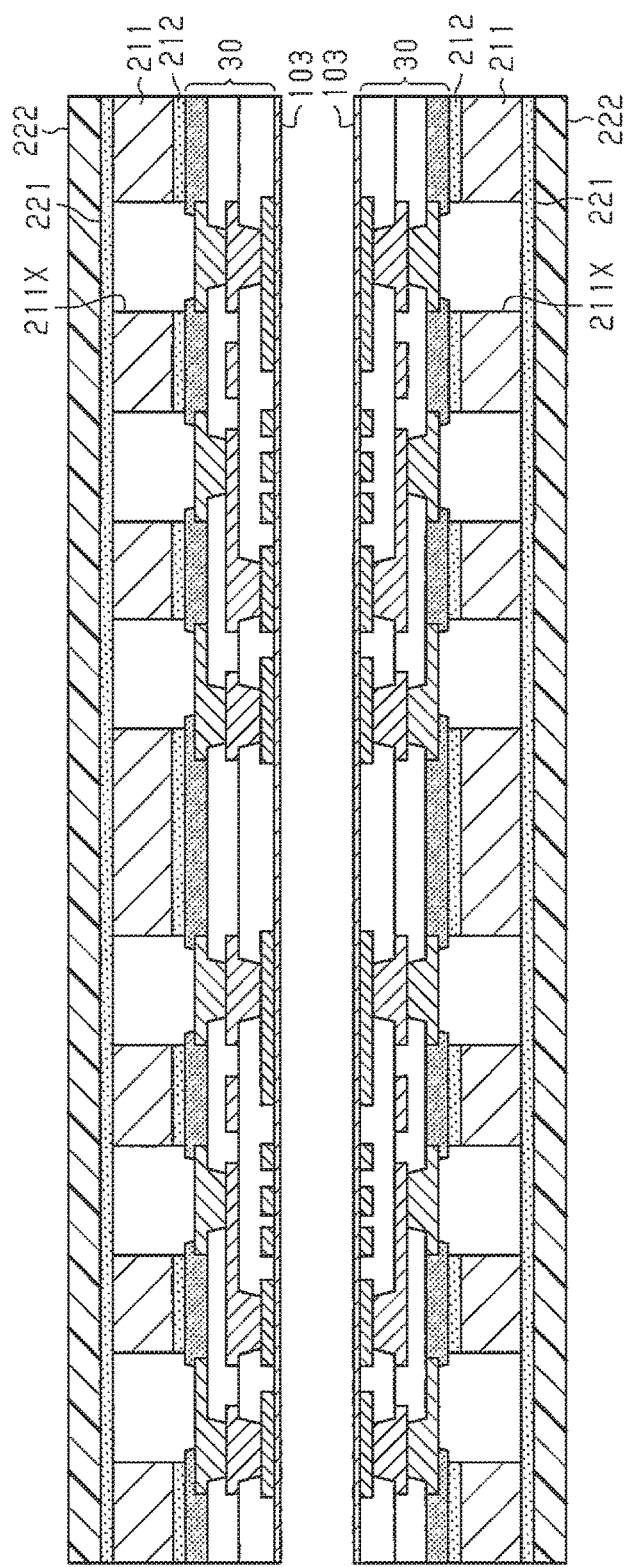

In the step of FIG. 14, the two wiring substrates 30 are separated from the support substrate 101 illustrated in FIG. 13. When removed from the support substrate 101, each wiring substrate 30 is supported by the carrier base material 211.

In the step of FIG. 15A, the metal layer 103 illustrated in FIG. 14 is etched and removed to expose the upper surfaces of the wiring layer 31 and the insulation layer 32. In this step, the openings 211X in the carrier base material 211 are closed by the adhesive layer 221 and the protection film 222. Accordingly, etching liquid does not enter the openings 211X. That is, the external connection terminals P2 are protected from etching liquid.

In the step of FIG. 15B, the protection film 222 is removed to expose the external connection terminals P2. Then, electrical tests are conducted on the wiring substrate 30 by having the probe terminals T2 contact the external connection terminals P2 and the probe terminals T1 contact the component connection terminals P1. The electrical test, which is conducted as described above, determines whether or not the wiring substrate 30 is defective. The wiring substrate 30 is marked in accordance with the determination result. For example, a given marking is indicated on the wiring substrate 30 when determined as being defective.

The manufacturing steps of a semiconductor device using the carrier base material-added wiring substrate 200 will now be described.

In the step of FIG. 16A, the semiconductor elements 51 are mounted on the upper surface of the carrier base material-added wiring substrate 200. Then, an encapsulation resin 52 is formed to encapsulate the semiconductor elements 51. Here, when the wiring substrate 30 has not been marked in the electrical test, that is, when the wiring substrate 30 has been determined as being non-defective, the semiconductor element 51 is mounted on the wiring substrate 30. When the wiring substrate 30 has been marked, that is, when the wiring substrate 30 has been determined as being defective, the semiconductor element 51 is not mounted on the wiring substrate 30. Thus, time is not used in an unnecessary manner to mount a defective wiring substrate onto the semiconductor element 51. This also prevents the semiconductor element 51 from being wasted because of the semiconductor element 51 being mounted on a defective wiring substrate.

The encapsulation resin 52 covers the semiconductor elements 51 and the upper surface of the wiring substrate 30. The encapsulation resin 52 is formed from, for example, a thermosetting epoxy insulative resin. The insulative resin does not necessarily have to be thermosetting and may be photosensitive instead.

In the step of FIG. 16B, the carrier base material 211 and the adhesive layer 212 are removed. For example, the adhesive layer 212 is irradiated with ultraviolet rays to lower the adhesive force of the adhesive layer 212 and remove the carrier base material 211 and the adhesive layer 212.

Figure 17A:
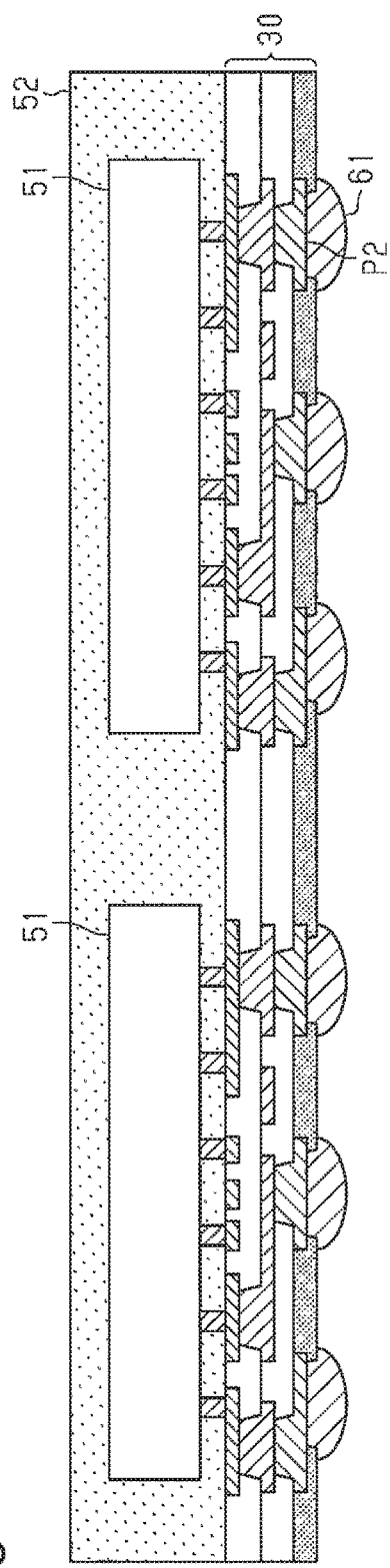

In the step of FIG. 17A, the bumps 61 are formed on the external connection terminals P2 for mounting on another substrate. The bumps 61 are, for example, solder bumps. The bumps 61 may be formed by solder balls arranged on the external connection terminals P2 or by a solder paste that has undergone a reflow process after being applied to the external connection terminals P2.

Figure 17B:
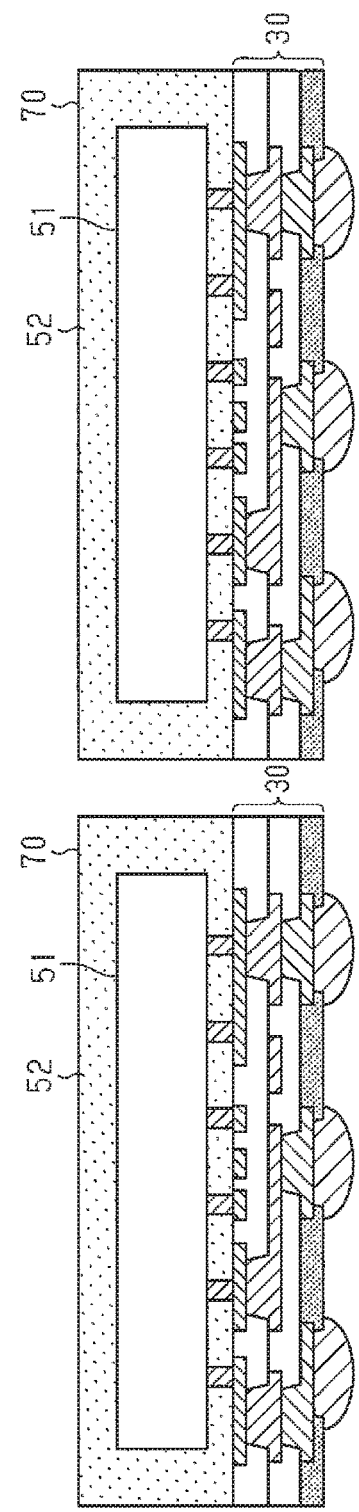

In the step of FIG. 17B, the structure of FIG. 17A is singulated into the semiconductor devices 70. The wiring substrate 30 and the encapsulation resin 52 illustrated in FIG. 17A are cut with a dicing blade or the like to singulate the semiconductor devices 70.

In the same manner as the carrier base material-added wiring substrate 10 of the above embodiment, the carrier base material-added wiring substrate 200 allows an electrical inspection to be conducted on the wiring substrate 30 in a state in which the wiring substrate 30 is supported by the carrier base material 211.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the structure of the carrier base material-added wiring substrate may be changed.

Figure 18:
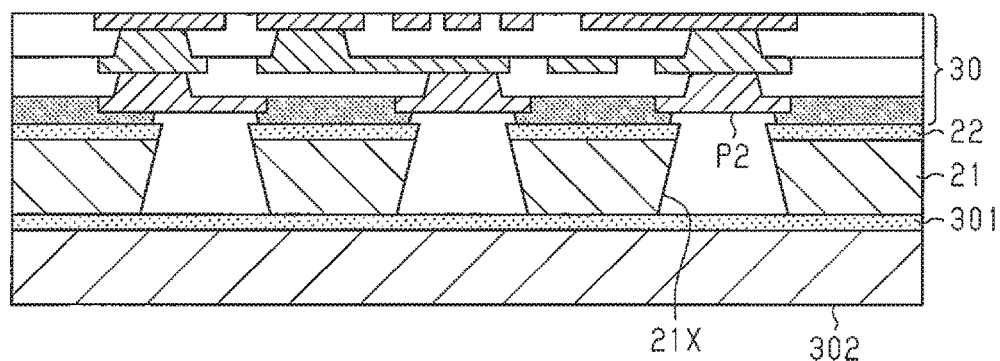
FIG. 18 is a schematic cross-sectional view illustrating a modified example of the carrier base material-added wiring substrate.

Referring to FIG. 18, a carrier base material 302 may be adhered by an adhesive layer 301 to the lower surface of the carrier base material 21. The two layers of the carrier base materials 21 and 302 increase rigidity and facilitate handling. Further, the carrier base material 302 closes the openings 21X of the carrier base material 21. This prevents foreign matter, such as liquid or dust, from entering the openings 21X. In this case, the protection film 222 (refer to FIG. 13) may be adhered to the carrier base material 21 instead of the carrier base material 302. The carrier base material 302 or the protection film 222 may be applied, for example, after the electrical test illustrated in FIG. 6. Further, subsequent to the step of FIG. 3, the openings 21X and 22X are formed in the carrier base material 21 and the adhesive layer 22 to expose the external connection terminals P2 like in FIG. 5B. Further, referring to FIG. 4, before separating the wiring substrate 30 from the support substrate 101, the carrier base material 302 or the protection film 222 may be adhered to the carrier base material 21. In this case, when conducting an electrical test, the carrier base material 302 or the protection film 222 need to be removed.

In the above embodiment and modified examples, wiring may be formed on the surface of the carrier base material and in the openings of the carrier base material (e.g., in FIG. 1A, on lower surface of carrier base material 21 and in openings 21X of carrier base material 21). Further, a buildup substrate, which includes a wiring layer and an insulation layer, and a wiring substrate, which includes a core substrate, may be used as the carrier base material.

In the above embodiment and modified examples, the number of blocks C1 (refer to FIG. 1B) included in the carrier base material-added wiring substrate 10 and the number of regions C2 included in each block C1 may be changed. Further, the number of blocks C1 included in the work substrate 40 (refer to FIG. 9A), that is, the number of carrier base material-added wiring substrates 10 formed from the work substrate 40, may be changed.

In the above embodiment and modified examples, the number of insulation layers and wiring layers of the wiring substrate 30 may be changed.

In the above embodiment and modified examples, a solder resist layer including openings that expose the component connection terminals P1 may be formed on the upper surface of the insulation layer 32 of the wiring substrate 30.

Clauses

This disclosure further encompasses embodiments described below.

1. A method for manufacturing a carrier base material-added wiring substrate, the method including:
    forming a wiring substrate on one of an upper surface and a lower surface of a support body, wherein the forming a wiring substrate includes
        alternately stacking a wiring layer and an insulation layer on one of the upper surface and the lower surface of the support body, and
        forming a solder resist layer including an opening that exposes a portion of the wiring layer as an external connection terminal;
    adhering a carrier base material with an adhesive layer to the solder resist layer;
    forming an opening in the carrier base material, wherein the opening of the carrier base material is in communication with the opening of the solder resist layer to expose the external connection terminal, and the opening of the carrier base material has a diameter that is smaller than that of the opening of the solder resist layer; and
    conducting an electrical test by having a probe contact the external connection terminal from the opening of the carrier base material.

2. The method according to clause 1, further including:
    separating the wiring substrate from the support body after adhering the carrier base material with the adhesive layer to the solder resist layer and before forming the opening in the carrier base material.

3. The method according to clause 1 or 2, further including:
    forming a second wiring substrate having a structure identical to the wiring substrate on the other one of the upper surface and the lower surface of the support body; and
    adhering a carrier base material with an adhesive layer to a solder resist layer of the second wiring substrate.

4. The method according to any one of clauses 1 to 3, wherein:
    the carrier base material includes an upper surface contacting the adhesive layer and a lower surface at a side opposite to the upper surface,
    wherein the opening of the carrier base material includes a first diameter at an upper surface of the carrier base material and a second diameter at a lower surface of the carrier base material, the second diameter is larger than the first diameter, and the first diameter is smaller than the diameter of the opening of the solder resist layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A carrier base material-added wiring substrate comprising:

a wiring substrate including
an insulation layer,
a wiring layer arranged on a lower surface of the insulation layer, and
a solder resist layer that covers the lower surface of the insulation layer and includes
an opening that exposes a portion of the wiring layer as an external connection terminal;
an adhesive layer including an opening that is in communication with the opening of the solder resist layer; and
a carrier base material that is adhered by the adhesive layer to the solder resist layer to form the carrier base material-added wiring substrate, wherein the carrier base material includes an opening that is in communication with the opening of the solder resist layer and the opening of the adhesive layer and exposes the external connection terminal,
wherein the opening of the carrier base material is tapered so that the diameter of the opening of the carrier base material decreases from a lower surface of the carrier base material toward an upper surface of the carrier base material, and the opening of the adhesive layer is tapered so that the diameter of the opening of the adhesive layer decreases from a lower surface of the adhesive layer toward an upper surface of the adhesive layer,
wherein each of the opening of the carrier base material and the opening of the adhesive layer has a diameter that is smaller than that of the opening of the solder resist layer, and
wherein the adhesive layer is a separation layer that is separable from the solder resist layer to remove the carrier base material and the adhesive layer from the carrier base material-added wiring substrate.

2. The carrier base material-added wiring substrate according to claim 1, wherein
the carrier base material includes an upper surface contacting the adhesive layer and a lower surface at a side opposite to the upper surface; and
the opening of the carrier base material has a first diameter at the upper surface of the carrier base material and a second diameter at the lower surface of the carrier base material, wherein the second diameter is larger than the first diameter, and the first diameter is smaller than the diameter of the opening of the solder resist layer.

3. The carrier base material-added wiring substrate according to claim 1, wherein
the wiring substrate includes a plurality of insulation layers and a plurality of wiring layers, the insulation layers and the wiring layers being alternately stacked upon one another,
an upper surface of an uppermost one of the insulation layers and an upper surface of an uppermost one of the wiring layers are exposed, and
the uppermost one of the wiring layers includes a component connection terminal on which an electronic component is mounted.

4. The carrier base material-added wiring substrate according to claim 1, wherein the adhesive layer is formed by a material of which adhesive force decreases when irradiated with ultraviolet rays.

5. The carrier base material-added wiring substrate according to claim 1, wherein the adhesive layer is formed by a material of which controllable adhesive force can be decreased.

* * * * *